(12) United States Patent
Choi et al.

(10) Patent No.: US 11,749,536 B2
(45) Date of Patent: Sep. 5, 2023

(54) SEMICONDUCTOR DEVICE AND METHOD OF FABRICATING THE SAME

(71) Applicant: Samsung Electronics Co., Ltd., Suwon-si (KR)

(72) Inventors: Byoungdeog Choi, Suwon-si (KR); Jangseop Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 238 days.

(21) Appl. No.: 17/355,478

(22) Filed: Jun. 23, 2021

(65) Prior Publication Data
US 2021/0320015 A1    Oct. 14, 2021

Related U.S. Application Data

(62) Division of application No. 16/399,098, filed on Apr. 30, 2019, now Pat. No. 11,056,355.

(30) Foreign Application Priority Data

Oct. 4, 2018    (KR) .................... 10-2018-0118213

(51) Int. Cl.
*H01L 21/311*    (2006.01)
*H01L 21/033*    (2006.01)
*H01L 21/56*    (2006.01)

(52) U.S. Cl.
CPC ........ *H01L 21/565* (2013.01); *H01L 21/0337* (2013.01); *H01L 21/31116* (2013.01); *H01L 21/31144* (2013.01)

(58) Field of Classification Search
CPC .......... H01L 23/3192; H01L 21/31144; H01L 21/565
See application file for complete search history.

(56) References Cited

U.S. PATENT DOCUMENTS 5,961,791 A    10/1999    Frisa et al.
6,506,674 B2    1/2003    Ikeda et al.
(Continued)

FOREIGN PATENT DOCUMENTS

CN    1921114 A    2/2007
CN    103681806 A    3/2014
(Continued)

OTHER PUBLICATIONS

Schaepkens, Marc; A Review of SiO2 Etching Studies in Inductively Coupled Fluorocarbon Plasmas; Journal of The Electrochemical Society C211-C221, 2001.
(Continued)

*Primary Examiner* — Dale E Page
*Assistant Examiner* — Wilner Jean Baptiste
(74) *Attorney, Agent, or Firm* — HARNESS, DICKEY & PIERCE, P.L.C.

(57) ABSTRACT

A method of fabricating a semiconductor may include forming on a substrate a mold structure including a mold layer, a buffer layer, and a support layer, performing on the mold structure an anisotropic etching process to form a plurality of through holes in the mold structure, and forming a plurality of bottom electrodes in the through holes. The buffer layer has a nitrogen content amount that increases as approaching the support layer from the mold layer. The buffer layer has an oxygen content amount that increases as approaching the mold layer from the support layer.

20 Claims, 14 Drawing Sheets

(56) References Cited

U.S. PATENT DOCUMENTS

| | | |
|---|---|---|
| 7,820,507 B2 | 10/2010 | Choi |
| 8,728,898 B2 | 5/2014 | Kim |
| 9,093,500 B2 | 7/2015 | Park et al. |
| 9,437,607 B2 | 9/2016 | Park et al. |
| 9,634,039 B2 | 4/2017 | Choi et al. |
| 10,622,305 B2 | 4/2020 | Kang |
| 2002/0019109 A1 | 2/2002 | Iizuka |
| 2003/0129847 A1 | 7/2003 | Celii et al. |
| 2003/0170993 A1 | 9/2003 | Nagahara et al. |
| 2006/0022245 A1 | 2/2006 | Jeong et al. |
| 2011/0294276 A1 | 12/2011 | Kuroki |
| 2013/0230961 A1 | 9/2013 | Kim et al. |
| 2014/0295668 A1 | 10/2014 | Avasarala |
| 2017/0069633 A1* | 3/2017 | Kim ................... H10B 12/033 |
| 2018/0026040 A1 | 1/2018 | Hong et al. |
| 2018/0158867 A1* | 6/2018 | Kim ...................... H10N 50/01 |

FOREIGN PATENT DOCUMENTS

| | | |
|---|---|---|
| CN | 103972158 A | 8/2014 |
| CN | 207353251 U | 5/2018 |
| JP | 2011-249583 A | 12/2011 |
| JP | 2013-197281 A | 9/2013 |
| JP | 2014-123677 A | 7/2014 |
| KR | 10-0757652 | 9/2007 |
| KR | 10-2017-0000894 A | 1/2017 |

OTHER PUBLICATIONS

Schaepkens, M.; Study of the SiO2-to-Si3N4 Etch Selectivity Mechanism in Inductively Coupled Fluorocarbon Plasmas and a Comparison withthe SiO2-to-Si Mechanism; Journal of Vacuum Science & Technology; 26-37, 1999.

* cited by examiner

SEMICONDUCTOR DEVICE AND METHOD OF FABRICATING THE SAME

CROSS-REFERENCE TO RELATED APPLICATION

This U.S. nonprovisional application is a divisional application of U.S. application Ser. No. 16/399,098, filed on Apr. 30, 2019, which claims priority under 35 U.S.C § 119 to Korean Patent Application No. 10-2018-0118213 filed on Oct. 4, 2018 in the Korean Intellectual Property Office, the entire contents of each of which are hereby incorporated by reference.

BACKGROUND

The present inventive concepts relate to a semiconductor device and/or a method of fabricating the same. For example, at least some example embodiments relate to a semiconductor device with improved reliability and/or a method of fabricating the same.

There has recently been an increasing demand for light, small, fast, multifunctional, excellently performing, and highly reliable products in the electronic industry such as mobile phones and laptop computers. To meet these requirements, it is demanded to increase integration and also to improve performance of semiconductor memory devices.

Increasing a capacity of a capacitor is one approach to improve reliability of highly-integrated semiconductor memory devices. The higher an aspect ratio of a bottom electrode of the capacitor, the larger the capacity of the capacitor. Thus, research has been variously conducted on process technology for forming the capacitor whose aspect ratio is high.

SUMMARY

Some example embodiments of the present inventive concepts provide a semiconductor device with improved reliability.

Some example embodiments of the present inventive concepts provide a method of fabricating a semiconductor device with improved reliability.

Example embodiments of the present inventive concepts are not limited to the mentioned above, and other example embodiments which have not been mentioned above will be clearly understood to those skilled in the art from the following description.

According to some example embodiments of the present inventive concepts, a method of fabricating a semiconductor device may include forming, on a substrate, a mold structure including a mold layer, a buffer layer, and a support layer such that a nitrogen content of the buffer layer increases in a direction approaching the support layer from the mold layer and an oxygen content of the buffer layer increases in a direction approaching the mold layer from the support layer; performing an anisotropic etching process on the mold structure to form a plurality of through holes in the mold structure; and forming a plurality of bottom electrodes in respective ones of the plurality of through holes.

According to some example embodiments of the present inventive concepts, a method of fabricating a semiconductor device may include forming a mold layer on a substrate; forming a buffer layer on the mold layer using a first gas and a second gas by gradually decreasing an amount of the first gas and gradually increasing an amount of the second gas, the first gas including oxygen and the second gas including nitrogen; forming a support layer on the buffer layer; forming a through hole by performing an anisotropic etching process to sequentially anisotropically etch the support layer, the buffer layer, and the mold layer; and forming a bottom electrode in the through hole.

According to some example embodiments of the present inventive concepts, a semiconductor device may include a bottom electrode on a substrate; a first support layer on a sidewall of the bottom electrode; a second support layer above the first support layer and on the sidewall of the bottom electrode; and a dielectric layer covering the sidewall and a top surface of the bottom electrode. The bottom electrode may include a lower segment between the first support layer and the second support layer; and an upper segment between the lower segment and the second support layer, the upper segment having a sidewall that protrudes from a sidewall of the lower segment such that a center of the sidewall has a sharp point.

DETAILED DESCRIPTION

Figure 1A:
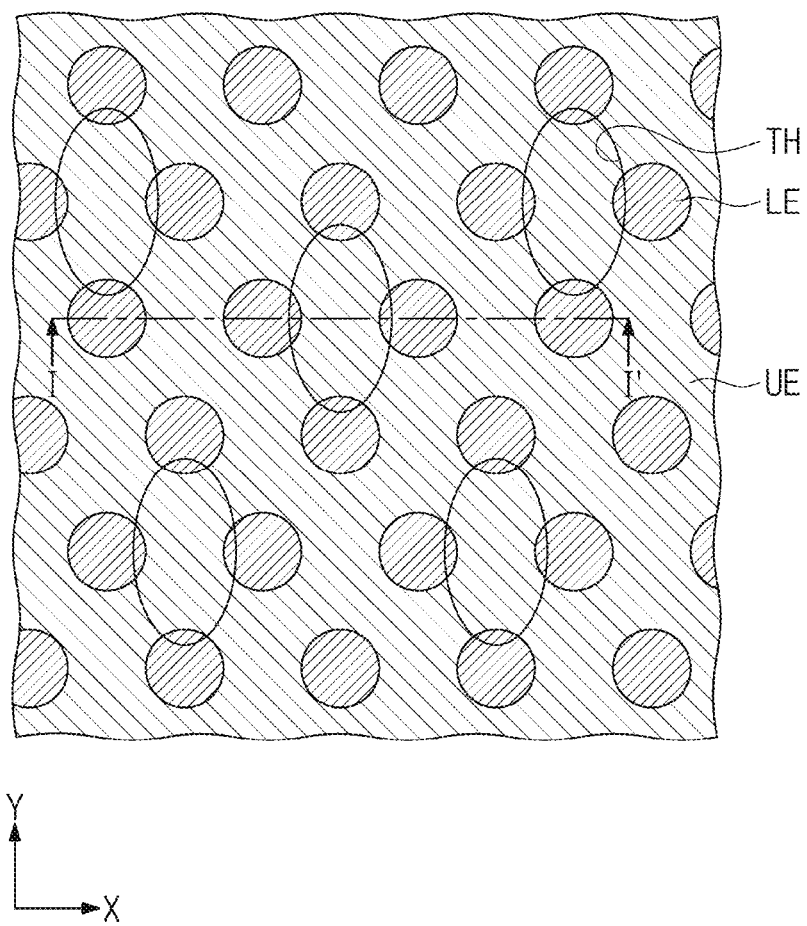
FIG. 1A illustrates a plan view showing a semiconductor device according to some example embodiments of the present inventive concepts.
Figure 1B:
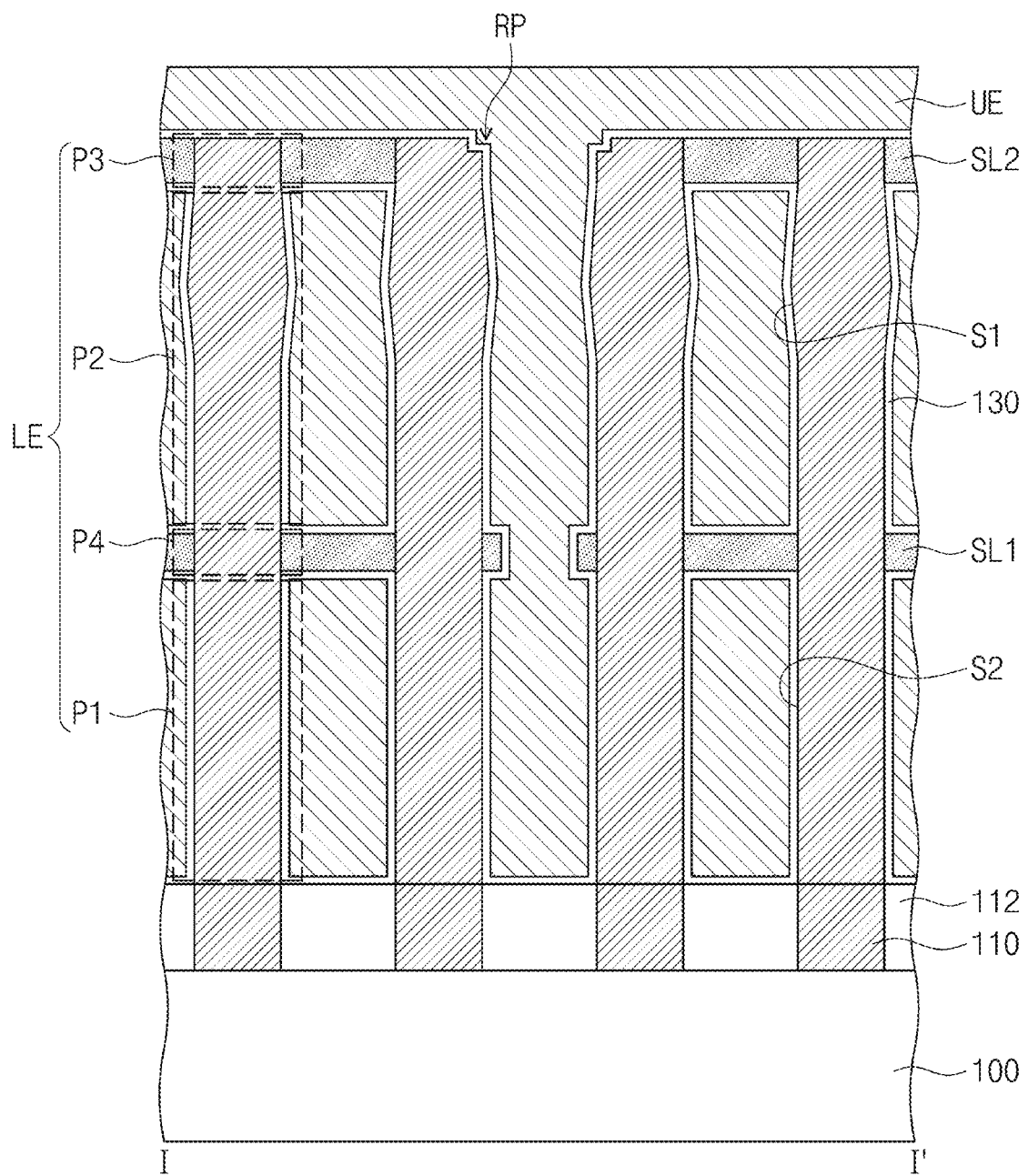
FIG. 1B illustrates a cross-sectional view taken along line I-I' of FIG. 1A, showing a semiconductor device according to some example embodiments of the present inventive concepts.
Figure 1C:
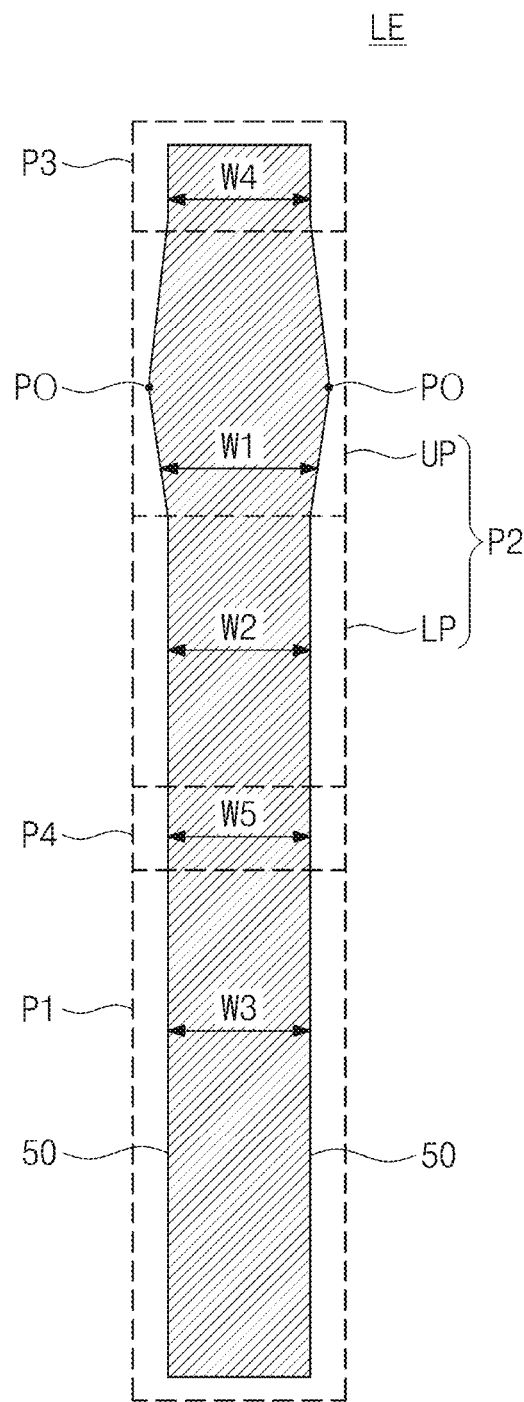
FIG. 1C illustrates an enlarged view showing a bottom electrode of FIG. 1B.

FIG. 1A illustrates a plan view showing a semiconductor device according to some example embodiments of the present inventive concepts. FIG. 1B illustrates a cross-sectional view taken along line I-I' of FIG. 1A, showing a semiconductor device according to some example embodiments of the present inventive concepts. FIG. 1C illustrates an enlarged view showing a bottom electrode of FIG. 1B.

Referring to FIGS. 1A and 1B, a semiconductor device may include contact plugs 110, bottom electrodes LE, a first support layer SL1, a second support layer SL2, a dielectric layer 130, and a top electrode UE.

The contact plugs 110 may be disposed on a substrate 100. The substrate 100 may be a semiconductor substrate, such as a silicon (Si) substrate, a germanium (Ge) substrate, or a silicon-germanium (SiGe) substrate. The contact plugs 110 may be arranged in a zigzag fashion along a first direction X. The contact plugs 110 may include one or more of a semiconductor material (e.g., polysilicon), a metal-semiconductor compound (e.g., tungsten silicide), a conductive metal nitride layer (e.g., titanium nitride, tantalum nitride, or tungsten nitride), and a metallic material (e.g., titanium, tungsten, or tantalum).

An interlayer dielectric layer 112 may be disposed on the substrate 100. The interlayer dielectric layer 112 may fill a gap between the contact plugs 110 adjacent to each other. The interlayer dielectric layer 112 may include one or more of a silicon oxide layer, a silicon nitride layer, and a silicon oxynitride layer. Although not shown, a plurality of word lines and a plurality of bit lines crossing the word lines may be formed on and/or in the substrate 100. The interlayer dielectric layer 112 may be formed to cover the word lines and the bit lines. Impurity regions may be formed in the substrate 100 on opposite sides of each of the word lines, and each of the contact plugs 110 may be connected to one of the impurity regions.

The bottom electrodes LE may be disposed on the contact plugs 110. Each of the bottom electrodes LE may have, for example, a pillar or cylindrical shape that extends in a vertical direction from a top surface of the substrate 100. The bottom electrodes LE may include one or more of a metallic material (e.g., cobalt, titanium, nickel, tungsten, or molybdenum), a metal nitride layer (e.g., a titanium nitride (TiN) layer, a titanium silicon (TiSiN) layer, a titanium aluminum nitride (TiAlN) layer, a tantalum nitride (TaN) layer, a tantalum aluminum nitride (TaAlN) layer, or tungsten nitride (WN) layer), a noble metal layer (e.g., platinum (Pt), ruthenium (Ru), or iridium (Ir)), a conductive oxide layer (e.g., PtO, $RuO_2$, $IrO_2$, SRO($SrRuO_3$), BSRO(($Ba,Sr$)$RuO_3$), CRO($CaRuO_3$), LSCo), and a metal silicide layer. The bottom electrodes LE will be further discussed in detail below.

The first support layer SL1 may be disposed on sidewalls of the bottom electrodes LE. The first support layer SL1 may surround the sidewalls of the bottom electrodes LE. Above the first support layer SL1, the second support layer SL2 may be disposed on the sidewalls of the bottom electrodes LE. The second support layer SL2 may surround portions of the sidewalls of the bottom electrodes LE. The second support layer SL2 may be spaced apart in the vertical direction from the first support layer SL1. The second support layer SL2 may have a top surface at the same level as that of top surfaces of the bottom electrodes LE. The first support layer SL1 may be closer than the second support layer SL2 to the substrate 100. Each of the first and second support layers SL1 and SL2 may be, for example, a silicon carbonitride (SiCN) layer.

Referring together to FIGS. 1A, 1B, and 1C, each of the bottom electrodes LE may include a first part P1, a second part P2, a third part P3, and a fourth part P4.

The first part P1 may be positioned below the first support layer SL1, and the second part P2 may be positioned above the first support layer SL1. The second part P2 may be provided thereon with the third part P3 disposed to horizontally overlap the second support layer SL2, and the first part P1 and the second part P2 may be provided therebetween with the fourth part P4 disposed to horizontally overlap the first support layer SL1.

The second part P2 may include a lower segment LP and an upper segment UP. The lower segment LP may be disposed between the first support layer SL1 and the second support layer SL2, and the upper segment UP may be disposed between the lower segment LP and the second support layer SL2. For example, the lower segment LP may be disposed between the fourth part P4 and the third part P3, and the upper segment UP may be disposed between the lower segment LP and the third part P3.

The upper segment UP may have a width W1 greater than a width W2 of the lower segment LP. The width W1 of the upper segment UP may be a minimum width of the upper segment UP, and the width W2 of the lower segment LP may be a minimum width of the lower segment LP. The width W2 of the lower segment LP may be uniform. The width W1 of the upper segment UP may be non-uniform. For example, the width W1 of the upper segment UP may increase and decrease as approaching the second support layer SL2 from the first support layer SL1. The bottom electrode LE may have a sidewall 50, and the sidewall 50 of the lower segment LP may be flat and perpendicular to the top surface of the substrate 100. The sidewall 50 of the upper segment UP may be convex from the sidewall 50 of the lower segment LP. The sidewall 50 of the upper segment UP may be inclined. The sidewall 50 of the upper segment UP may be flat or curved. When the sidewall 50 of the upper segment UP is flat, the sidewall 50 of the upper segment UP may have a sharp point PO at its center. A width W3 of the first part P1, a width W4 of the third part P3, and a width W5 of the fourth part P4 may be substantially the same as the width W2 of the lower segment LP of the second part P2. The widths W3, W4, and W5 of the first, third, and fourth parts P1, P3, and P4 may be uniform.

Through holes TH may be disposed between the bottom electrodes LE adjacent to each other. Each of the through holes TH may be disposed at an intersection between a pair of the bottom electrodes LE adjacent to each other in the first direction X and also between a pair of the bottom electrodes LE adjacent to each other in a second direction Y intersecting the first direction X. For example, the through hole TH may extend from a gap between concave segments RP, which are exposed by the second support layer SL2, of the bottom electrodes LE toward a gap between the second parts P2 of the bottom electrodes LE. The through hole TH may further extend from the gap between the second parts P2 of the bottom electrodes LE toward a gap between the first parts P1 of the bottom electrodes LE, while passing through the first support layer SL1. When viewed in plan, a plurality of the through holes TH may be arranged in a zigzag fashion along the first direction X.

The top electrode UE may be disposed on the bottom electrodes LE. The top electrode UE may be disposed on the top surfaces of the bottom electrodes LE, the sidewalls 50 of the bottom electrodes LE exposed by the first and second support layers SL1 and SL2, top and bottom surfaces of the first and second support layers SL1 and SL2, and lateral surfaces of the first support layers SL1. The top electrode UE may fill first spaces S1, second spaces S2, and the through holes TH. Between the bottom electrodes LE, the first spaces S1 may be defined by the first support layer SL1 and the second support layer SL2. Between the bottom electrodes LE, the second spaces S2 may be defined by the interlayer dielectric layer 112 and the first support layer SL1. The top electrode UE may be formed of one or more of an impurity-doped semiconductor material, a metallic material, a metal nitride material, and a metal silicide material. The top electrode UE may be formed of a refractory metallic material, such as cobalt, titanium, nickel, tungsten, and molybdenum. The upper electrode UE may be formed of metal nitride, such as titanium nitride (TiN), titanium aluminum nitride (TiAlN), and tungsten nitride (WN). The top electrode UE may be formed of metal, such as platinum (Pt), ruthenium (Ru), and iridium (Ir).

The dielectric layer 130 may be interposed between the top electrode UE and the bottom electrodes LE. For example, the dielectric layer 130 may conformally cover the top surfaces of the bottom electrodes LE, the sidewalls 50 of the bottom electrodes LE exposed by the first and second support layers SL1 and SL2, the top and bottom surfaces of the first and second support layers SL1 and SL2, and the lateral surfaces of the first support layers SL1. The dielectric layer 130 may be formed of a single layer, or a combination thereof, including at least one selected from the group consisting of metal oxide, such as $HfO_2$, $ZrO_2$, $Al_2O_3$, $La_2O_3$, $Ta_2O_3$, and $TiO_2$, and a perovskite dielectric material, such as $SrTiO_3$(STO), $(Ba,Sr)TiO_3$(BST), $BaTiO_3$, PZT, and PLZT.

Figure 2A:
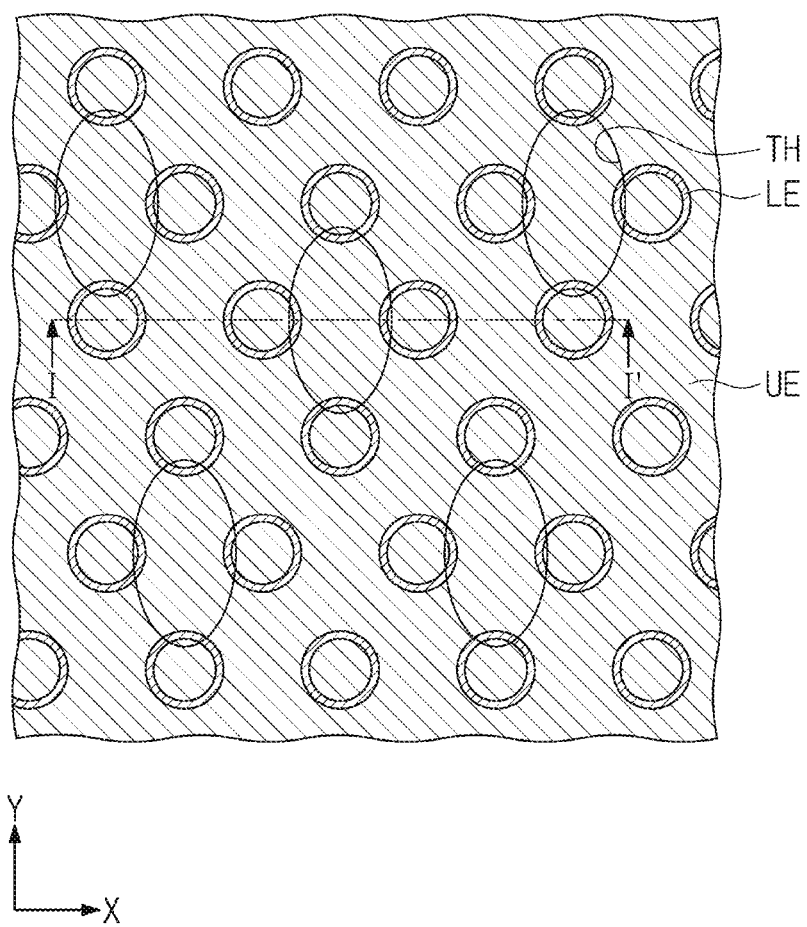
FIG. 2A illustrates a plan view showing a semiconductor device according to some example embodiments of the present inventive concepts.
Figure 2B:
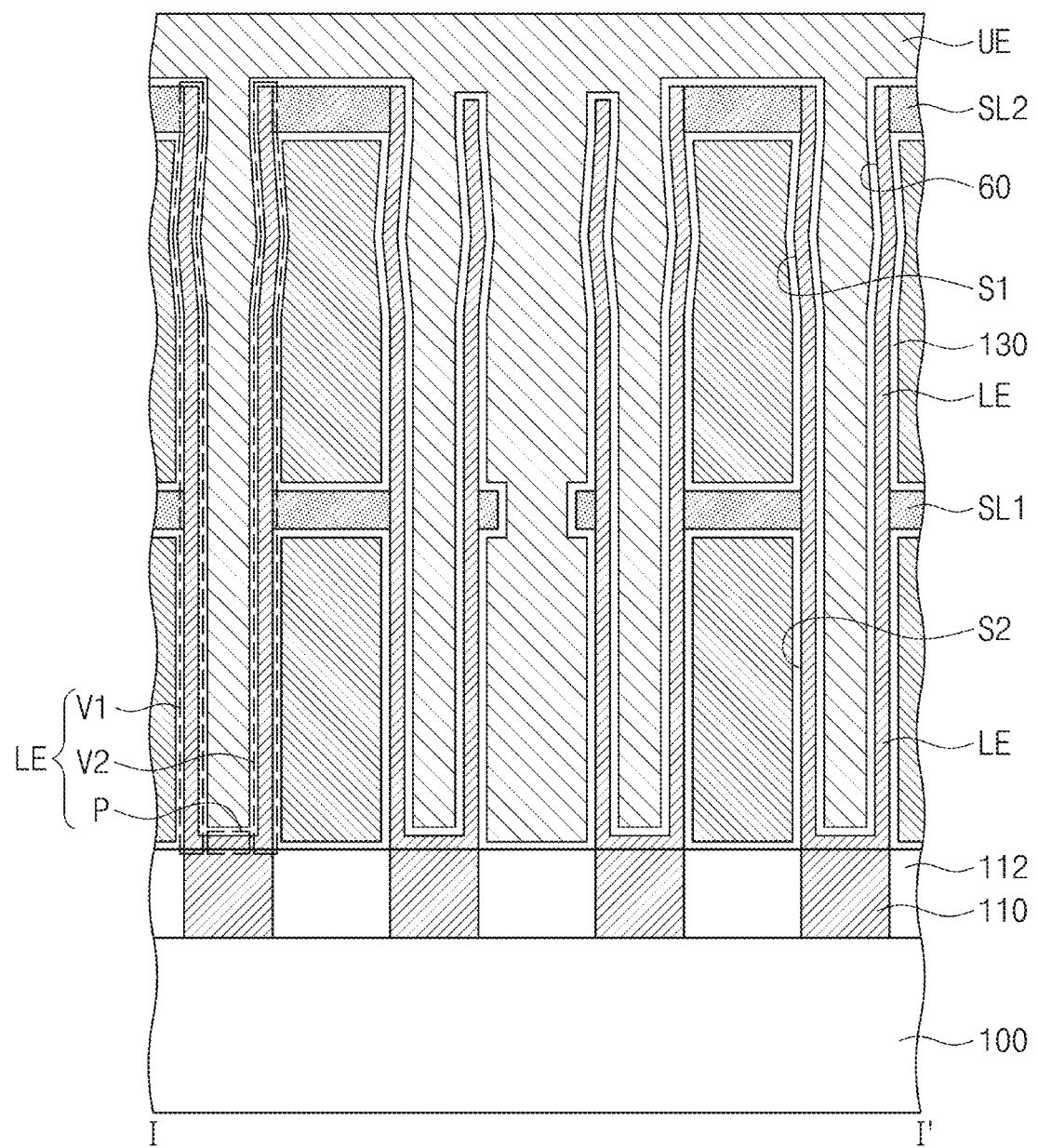
FIG. 2B illustrates a cross-sectional view taken along line I-I' of FIG. 2A, showing a semiconductor device according to some example embodiments of the present inventive concepts.
Figure 2C:
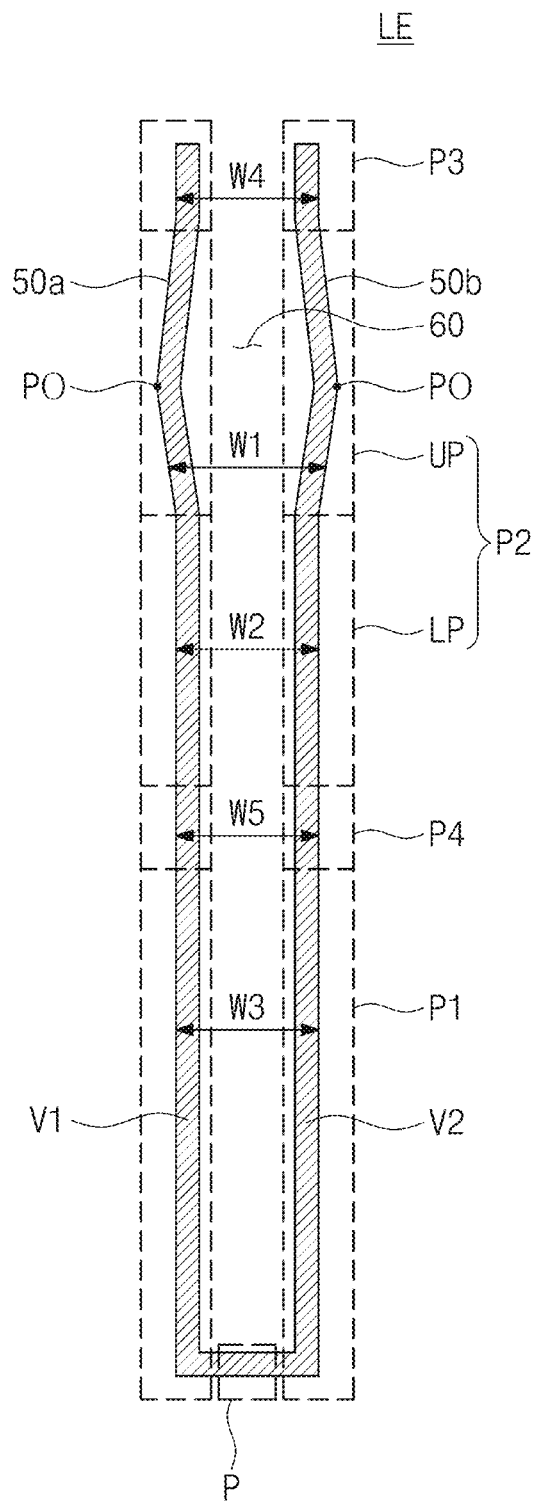
FIG. 2C illustrates an enlarged view showing a bottom electrode of FIG. 2B.

FIG. 2A illustrates a plan view showing a semiconductor device according to some example embodiments of the present inventive concepts. FIG. 2B illustrates a cross-sectional view taken along line I-I' of FIG. 2A, showing a semiconductor device according to some example embodiments of the present inventive concepts. FIG. 2C illustrates an enlarged view showing a bottom electrode of FIG. 2B.

Referring to FIGS. 2A to 2C, the bottom electrode LE may include a first vertical part V1, a second vertical part V2 that is parallel to and spaced apart in the first direction X from the first vertical part V1, and a horizontal part P that extends in the second direction Y and connects the first vertical part V1 to the second vertical part V2. The horizontal part P may connect a lower portion of the first vertical part V1 to a lower portion of the second vertical part V2. The horizontal part P may contact the contact plug 110. The bottom electrode LE may have a U shape that elongates in the vertical direction. Each of the widths W1, W2, W3, W4, and W5 of the bottom electrode LE may correspond to a distance between an outer wall 50a of the first vertical part V1 and an outer wall 50b of the second vertical part V2.

The dielectric layer 130 may conformally cover inner walls and bottom surfaces of the bottom electrodes LE, which bottom surfaces are disposed in inner spaces 60 of the bottom electrodes LE. The top electrode UE may lie on the dielectric layer 130 and may fill the inner spaces 60 of the bottom electrodes LE.

FIGS. 3, 4, and 6 to 10 illustrate cross-sectional views taken along line I-I' of FIG. 1A, showing a method of fabricating a semiconductor device according to some example embodiments of the present inventive concepts. FIG. 5A illustrates an enlarged view showing a buffer layer that has been etched. FIG. 5B illustrates an enlarged view showing section A of FIG. 4.

Figure 3:
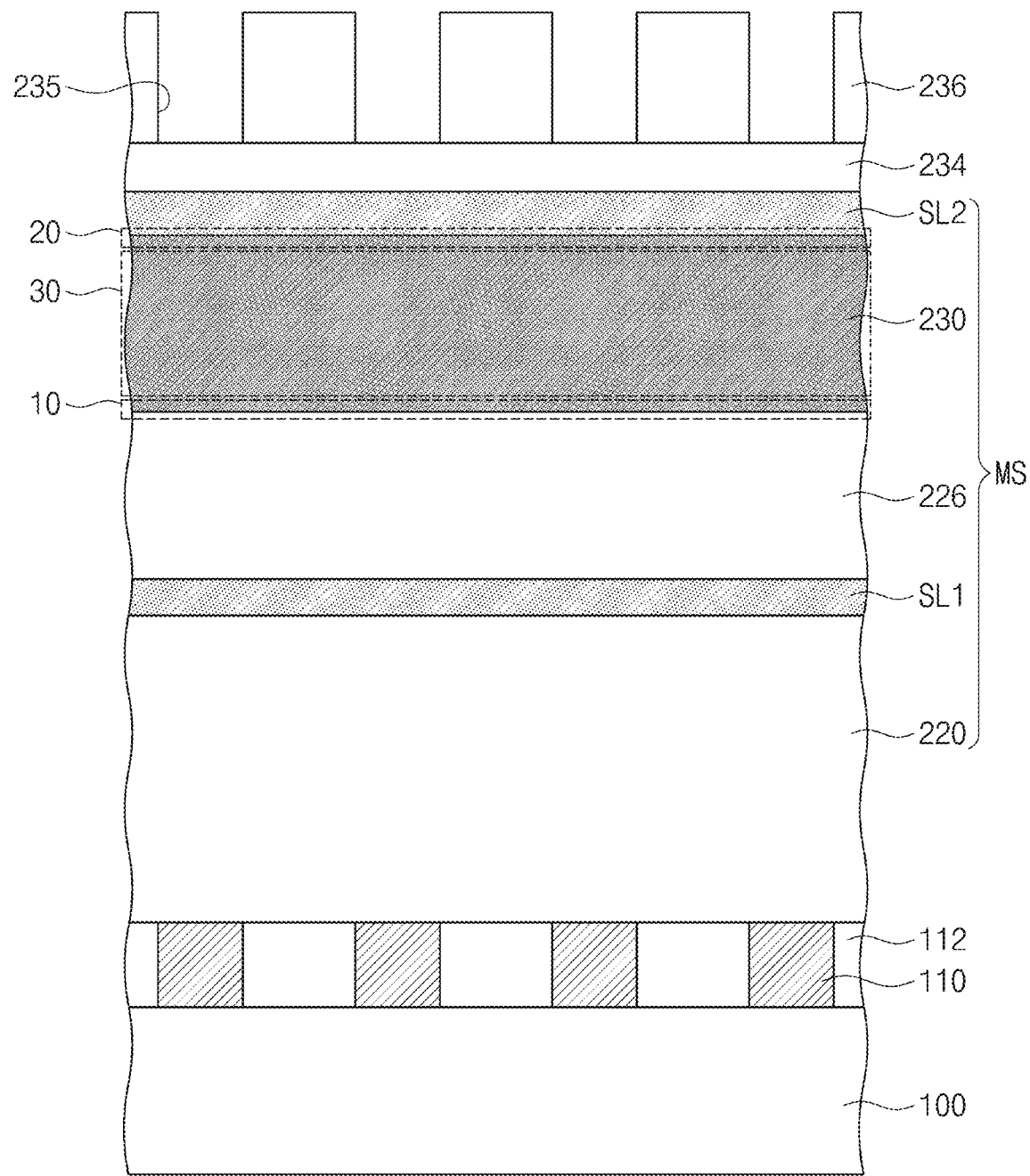
FIGS. 3, 4, and 6 to 10 illustrate cross-sectional views taken along line I-I' of FIG. 1A, showing a method of fabricating a semiconductor device according to some example embodiments of the present inventive concepts.

Referring to FIG. 3, an interlayer dielectric layer 112 may be formed on a substrate 100. The substrate 100 may be a semiconductor substrate, such as a silicon (Si) substrate, a germanium (Ge) substrate, or a silicon-germanium (SiGe) substrate. The interlayer dielectric layer 112 may include one or more of a silicon oxide layer, a silicon nitride layer, and a silicon oxynitride layer.

Contact plugs 110 may be formed in the interlayer dielectric layer 112. The contact plugs 110 may include one or more of a semiconductor material (e.g., polysilicon), a metal-semiconductor compound (e.g., tungsten silicide), a conductive metal nitride layer (e.g., titanium nitride, tantalum nitride, or tungsten nitride), and a metallic material (e.g., titanium, tungsten, or tantalum). Although not shown, a plurality of word lines and a plurality of bit lines crossing the word lines may be formed on and/or in the substrate 100. The interlayer dielectric layer 112 may be formed to cover the word lines and the bit lines. Impurity regions (not shown) may be formed in the substrate 100 on opposite sides of each of the word lines, and each of the contact plugs 110 may be connected to one of the impurity regions.

A mold structure MS may be formed on the interlayer dielectric layer 112. The mold structure MS may include a first mold layer 220, a first support layer SL1, a second mold layer 226, a buffer layer 230, and a second support layer SL2. The first mold layer 220 may be, for example, a silicon oxide layer. The first support layer SL1 may include a material having an etch selectivity with respect to the first mold layer 220. The first support layer SL1 may be, for example, a silicon carbonitride (SiCN) layer. The second mold layer 226 may include a material having an etch selectivity with respect to the first support layer SL1. The second mold layer 226 may be, for example, a silicon oxide layer. The buffer layer 230 may be formed on the second mold layer 226.

The buffer layer 230 may include silicon, oxygen, and nitrogen. The buffer layer 230 may have a uniform amount of silicon contained therein. An amount of oxygen contained in the buffer layer 230 may gradually decrease as approaching the second support layer SL2 from the second mold layer 226, and an amount of nitrogen contained in the buffer layer 230 may gradually increase as approaching the second support layer SL2 from the second mold layer 226. For example, the buffer layer 230 may contain no nitrogen at its lower portion 10 adjacent to a top surface of the second mold layer 226, and may contain no oxygen at its upper portion 20 adjacent to the bottom surface of the second support layer SL2. The buffer layer 230 may contain nitrogen and oxygen at its middle portion 30 between the lower portion 10 and the upper portion 20. An amount of nitrogen contained in the middle portion 30 of the buffer layer 230 may increase as approaching the upper portion 20 from the lower portion 10 of the buffer layer 230, and an amount of oxygen contained in the middle portion 30 of the buffer layer 230 may decrease as approaching the upper portion 20 from the lower portion 10 of the buffer layer 230. The lower portion 10 of the buffer layer 230 may include silicon oxide, the upper portion 20 of the buffer layer 230 may include silicon nitride, and the middle portion 30 of the buffer layer 230 may include silicon oxynitride.

The buffer layer 230 may be formed using a first gas including silicon, a second gas including oxygen, and a third gas including nitrogen. The formation of the buffer layer 230 may include introducing the first and second gases, and gradually decreasing an introducing amount of the second gas while gradually increasing an introducing amount of the third gas. The gradual decrease in the introducing amount of the second gas may be performed simultaneously with the gradual increase in the introducing amount of the third gas. An introducing amount of the first gas may be constant from the beginning to the end of a deposition process for forming the buffer layer 230. The first gas may be or include, for example, $SiH_4$. The second gas may be or include, for example, $NH_3$. The third gas may be or include, for example, $N_2O$.

The second support layer SL2 may be formed on the buffer layer 230. The second support layer SL2 may include, for example, a silicon carbonitride (SiCN) layer. A first mask layer 234 and a second mask layer 236 may be sequentially formed on the mold structure MS. For example, the first mask layer 234 may be a silicon nitride layer, and the second mask layer 236 may be a polysilicon layer. The second mask layer 236 may have first openings 235 that expose portions of the first mask layer 234.

Figure 4:
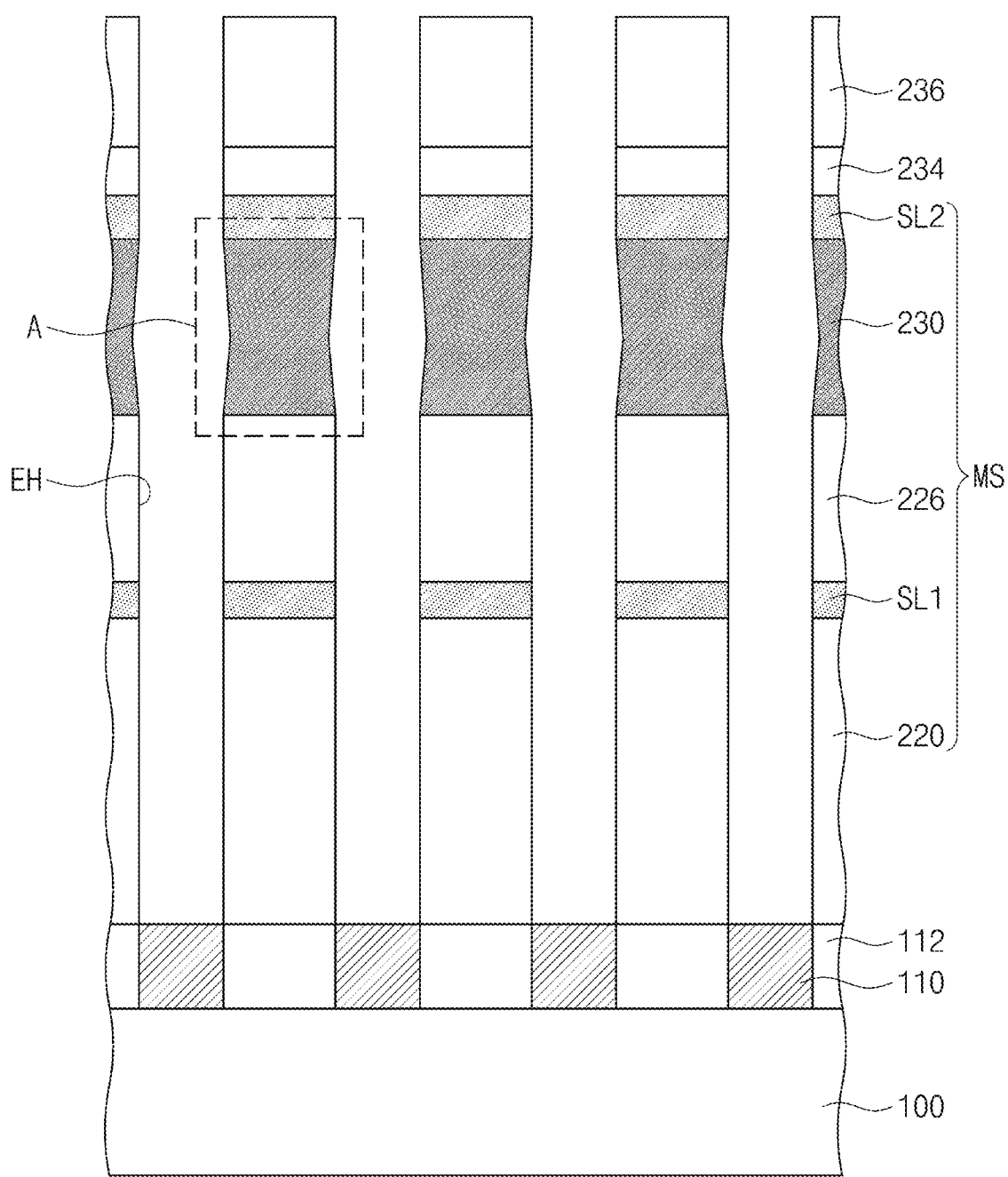
Figure 5A:
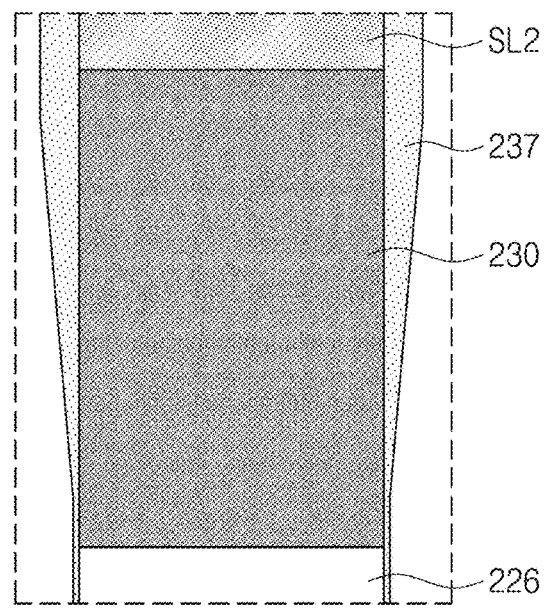
FIG. 5A illustrates an enlarged view showing a buffer layer that has been etched.
Figure 5B:
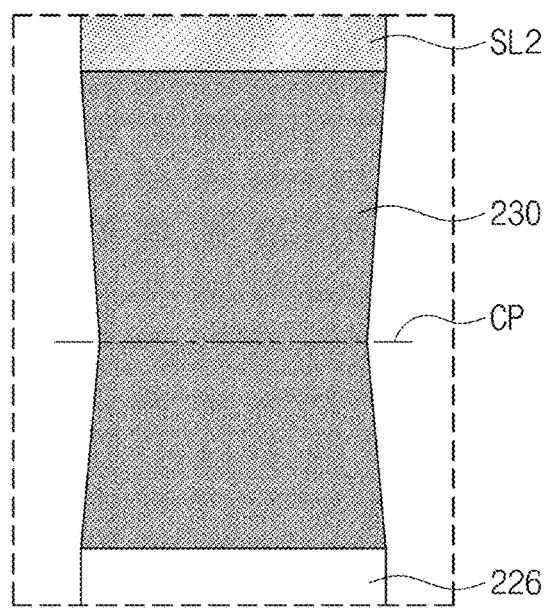
FIG. 5B illustrates an enlarged view showing section A of FIG. 4.

Referring to FIG. 4, the second mask layer 236 may be used as an etching mask to anisotropically etch the first mask layer 234 and the mold structure MS. Therefore, electrode holes EH may be formed in the mold structure MS. For example, the electrode holes EH may be formed by an anisotropic etching process to anisotropically etch the first mask layer 234, the second support layer SL2, the buffer layer 230, the second mold layer 226, the first support layer SL1, and the first mold layer 220. The anisotropic etching process may be, for example, a dry etching process. The dry etching process may use an etching gas, such as $CF_4$, $CF_4/O_2$, or $C_2F_6/O_2$. The first and second mask layers 234 and 236 may be etched and removed during the etching process. For another example, after the etching process, other etching process may be separately performed to etch and remove the first and second mask layers 234 and 236.

Referring together to FIGS. 5A and 5B, during the etching process in which the aforementioned etching gas is used to form the electrode holes EH, etch byproducts 237 may be formed on sidewalls of the electrode holes EH. A thickness of the etch byproduct 237 formed on an oxygen-containing layer may be less than that of the etch byproduct 237 formed on a nitrogen-containing layer. For example, a thickness of the etch byproduct 237 formed on a sidewall of the second mold layer 226 may be less than that of the etch byproduct 237 formed on a sidewall of the second support layer SL2. This may be because that oxygen etched away from the second mold layer 226 reacts with carbon of the etching gas to form carbon monoxide (CO) or carbon dioxide ($CO_2$), which reaction may result in evaporation of oxygen.

The etch byproducts 237 may be formed on sidewalls of the buffer layer 230 that are exposed to the electrode holes EH. Because an amount of oxygen contained in the buffer layer 230 increases as approaching the second mold layer 226 from the second support layer SL2, the etch byproduct 237 formed on the sidewalls of the buffer layer 230 may have a thickness that decreases as approaching the second mold layer 226 from the second support layer SL2. For this reason, the buffer layer 230 may be partially over-etched at its sidewall on which the etch byproduct 237 is formed. For example, an amount of over-etching on the sidewall of the buffer layer 230 may increase as approaching the second mold layer 226 from the second support layer SL2, and then may gradually decrease from a critical point CP of the buffer layer 230. The critical point CP may correspond to a location at which is reduced an energy of etching ions striking the sidewall of the buffer layer 230. The buffer layer 230 may be formed to have a concave sidewall. The buffer layer 230 may have a thickness that gradually decreases and increase again as approaching the second support layer SL2 from the second mold layer 226. The buffer layer 230 may have a minimum thickness at the critical point CP thereof.

After the anisotropic etching process, the etch byproduct 237 may be removed by an ashing process and/or a strip process.

Figure 6:
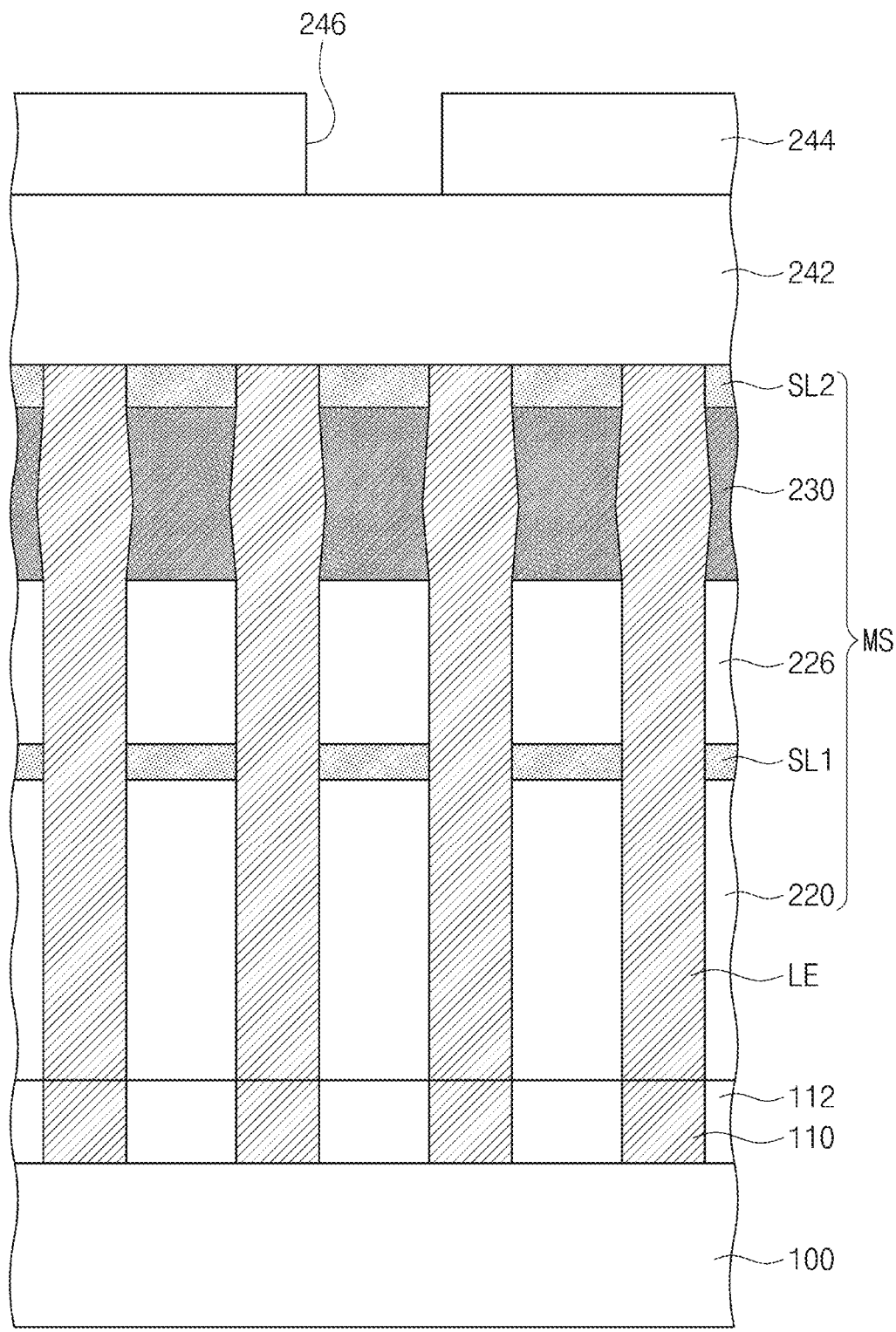

Referring to FIG. 6, bottom electrodes LE may be formed in the electrode holes EH. The formation of the bottom electrodes LE may include forming a conductive layer to fill the electrode holes EH and to cover a top surface of the mold structure MS, and then performing a planarization process on the conductive layer. Because each of the electrode holes EH has a high aspect ratio, a deposition process for forming the bottom electrodes LE may use a layer-formation technique having superior step coverage characteristics. For example, the bottom electrodes LE may be formed using chemical vapor deposition (CVD) or atomic layer deposition (ALD). The bottom electrodes LE may be formed to completely fill the electrode holes EH. In this case, each of the bottom electrodes LE may have a pillar shape. For another example, the bottom electrodes LE may be formed to conformally cover sidewalls and bottom surfaces of the electrode holes EH. In this case, each of the bottom electrodes LE may have a U shape.

The bottom electrodes LE may include one or more of a metallic material, a metal nitride layer, and a metal silicide layer. For example, the bottom electrodes LE may be formed of a refractory metallic material, such as cobalt, titanium, nickel, tungsten, and molybdenum. For another example, the bottom electrodes LE may be formed of a metal nitride layer, such as a titanium nitride (TiN) layer, a titanium silicon nitride (TiSiN) layer, a titanium aluminum nitride (TiAlN) layer, tantalum nitride (TaN) layer, a tantalum aluminum nitride (TaAlN) layer, and a tungsten nitride (WN) layer. For another example, the bottom electrodes EL may be formed of a noble metal layer including at least one selected from the group consisting of platinum (Pt), ruthenium (Ru), and iridium (Ir). For another example, the bottom electrodes LE may be formed of a conductive noble metal oxide layer, such as $PtO_2$, $RuO_2$, and $IrO_2$, or formed of a conductive oxide layer, such as $SRO(SrRuO_3)$, $BSRO((Ba,Sr)RuO_3)$, $CRO(CaRuO_3)$, and LSCo.

According to some example embodiments of the present inventive concepts, the buffer layer 230 may contain nitrogen whose amount gradually increases as approaching the second support layer SL2 from the second mold layer 226, and thus the buffer layer 230 may be prevented from being over-etched at a sidewall of the upper portion 20 adjacent to the second mold layer 226 when an anisotropic etching process is performed to form the electrode holes EH. A distance may therefore be sufficiently provided between the bottom electrodes LE formed in the electrode holes EH, and as a result, an electrical interference may be avoided between the bottom electrodes LE.

A third mask layer 242 may be formed on the mold structure MS having the bottom electrodes LE therein. The third mask layer 242 may be formed of a material having an etch selectivity with respect to the second support layer SL2. The third mask layer 242 may be, for example, an amorphous carbon layer (ACL). A photoresist layer 244 may be formed on the third mask layer 242. The photoresist layer 244 may have second openings 246. Each of the second openings 246 may vertically overlap a portion of the second support layer SL2 between a pair of the bottom electrodes LE adjacent to each other in a first direction (see X of FIG. 1) and also between a pair of the bottom electrodes LE adjacent to each other in a second direction (see Y of FIG. 1) intersecting the first direction X.

Figure 7:
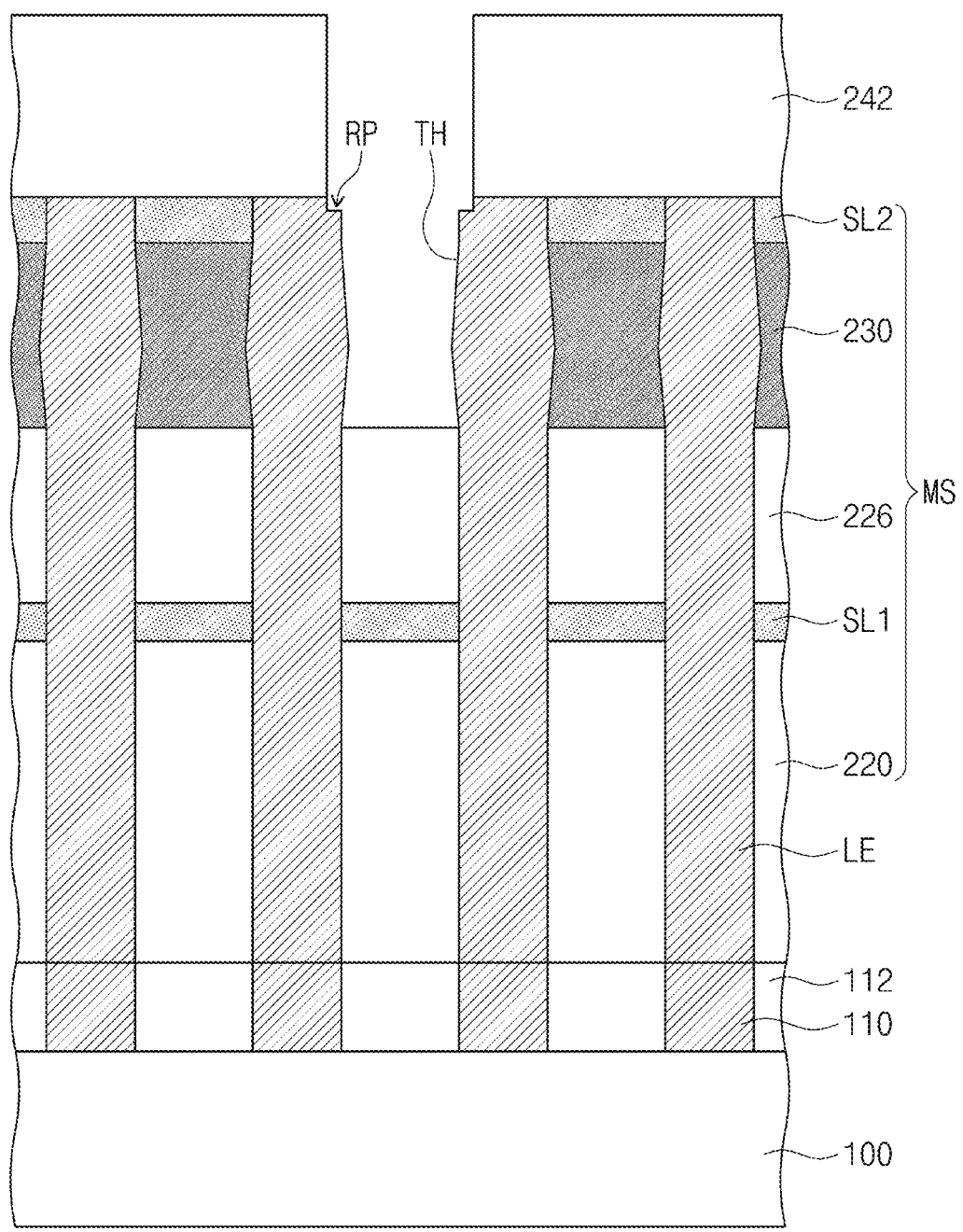

Referring to FIG. 7, an etching process may be performed in which the photoresist layer 244 is used as an etching mask to sequentially etch the third mask layer 242, the second support layer SL2, and the buffer layer 230. Therefore, through holes TH may be formed to penetrate the third mask layer 242, the second support layer SL2, and the buffer layer 230. The through holes TH may partially expose a top surface of the second mold layer 226, the sidewall of the buffer layer 230, and the sidewalls of the bottom electrodes LE. The etching process may partially etch upper portions of the bottom electrodes LE. Therefore, concave segments RP may be formed on portions of upper corners of the bottom electrodes LE. The concave segments RP may be recessed from top surfaces of the bottom electrodes LE. When the etching process is performed, the photoresist layer 244 may also be removed to expose a top surface of the third mask layer 242. The etching process may be, for example, a dry etching process. The dry etching process may use, for example, a CxFy gas or a CHxFy gas.

Figure 8:
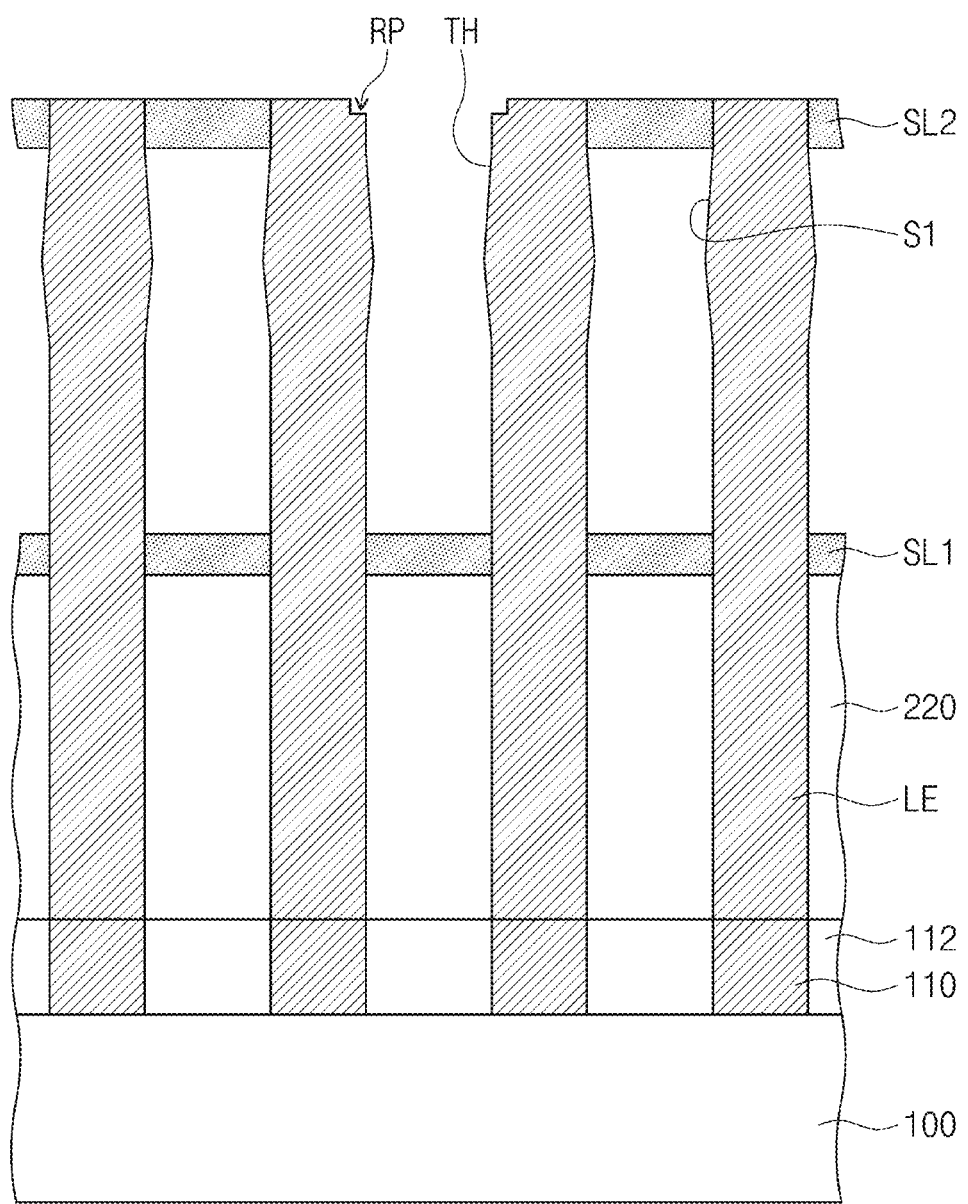

Referring to FIG. 8, the third mask layer 242 may be removed. The removal of the third mask layer 242 may expose a top surface of the second support layer SL2. The third mask layer 242 may be removed by, for example, an ashing process and/or a strip process. A removal process may be performed on the buffer layer 230 and the second mold layer 226 that are exposed to the through holes TH. The buffer layer 230 and the second mold layer 226 may be removed to form first spaces S1. Between the bottom electrodes LE, the first spaces Si may be defined by the first support layer SL1 and the second support layer SL2. The through holes TH and the first spaces S1 may expose sidewalls of the bottom electrodes LE between the first support layer SL1 and the second support layer SL2, a top surface of the first support layer SL1, and a bottom surface of the second support layer SL2. The buffer layer 230 and the second mold layer 226 may be removed by a wet etching process that uses an etchant having an etch selectivity with respect to the first and second support layers SL1 and SL2. For example, the etchant may include hydrofluoric acid (HF) or limulus amoebocyte lysate (LAL).

Figure 9:
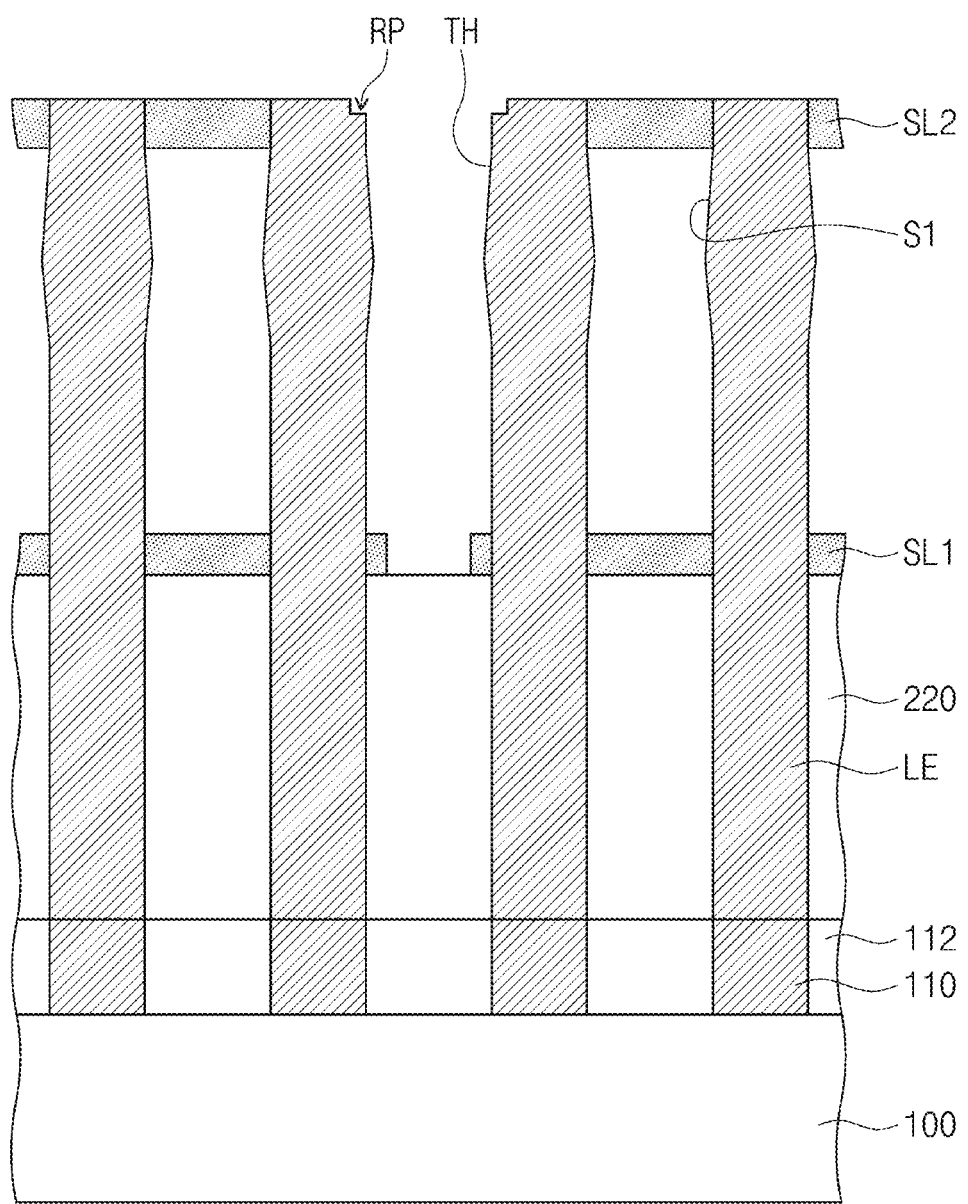

Referring to FIG. 9, an etching process may be performed to etch portions of the first support layer SL1 exposed to the through holes TH. The portions of the first support layer SL1 may be removed to allow the through holes TH to partially expose a top surface of the first mold layer 220. When the etching process is performed to etch the portions of the first support layer SL1, an over-etching may occur to partially remove an upper portion of the first mold layer 220.

Figure 10:
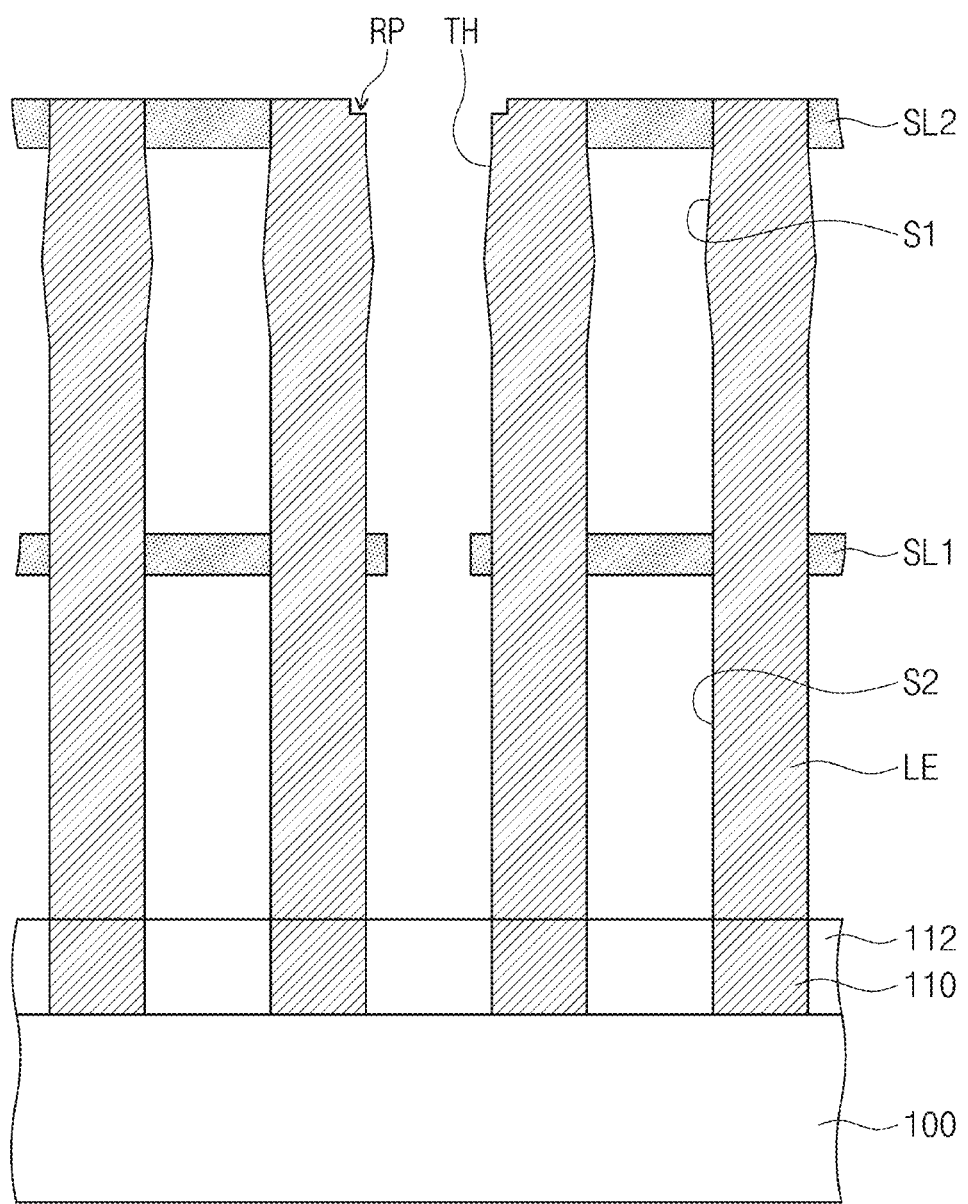

Referring to FIG. 10, a removal process may be performed on the first mold layer 220 exposed by the first support layer SL1. The first mold layer 220 may thus be removed to form second spaces S2. Between the bottom electrodes LE, the second spaces S2 may be defined by the interlayer dielectric layer 112 and the first support layer SL1. The through holes TH and the second spaces S2 may expose sidewalls of the bottom electrodes LE disposed below the first support layer SL1, a top surface of the interlayer dielectric layer 112, and a bottom surface of the first support layer SL1. The first mold layer 220 may be removed by a wet etching process that uses an etchant having an etch selectivity with respect to the first and second support layers SL1 and SL2. For example, the first mold layer 220 may be removed using hydrofluoric acid (HF) or limulus amoebocyte lysate (LAL).

Referring back to FIG. 1B, a dielectric layer 130 may be formed on the substrate 100. The dielectric layer 130 may conformally cover the top surface of the interlayer dielectric layer 112, the sidewalls of the bottom electrodes LE, the top, bottom, and lateral surfaces of the first support layer SL1, and the top and bottom surfaces of the second support layer SL2. The dielectric layer 130 may be formed of a dielectric material that is provided through the through holes TH. The dielectric layer 130 may be formed using a layer-deposition technique, such as atomic deposition (ALD), having superior step coverage characteristics. The dielectric layer 130 may be formed of a single layer, or a combination thereof, including at least one selected from the group consisting of metal oxide, such as $HfO_2$, $ZrO_2$, $Al_2O_3$, $La_2O_3$, $Ta_2O_3$, and $TiO_2$, and a perovskite dielectric material, such as $SrTiO_3$ (STO), $(Ba,Sr)TiO_3$(BST), $BaTiO_3$, PZT, and PLZT.

A top electrode UE may be formed on the dielectric layer 130. The top electrode UE may be formed in the through holes TH, the first spaces S1, and the second spaces S2, while covering a top surface of the dielectric layer 130. The top electrode UE may conformally cover the top surface of the dielectric layer 130. Therefore, the top electrode UE may completely fill neither the through holes TH, nor the first spaces S1, nor the second spaces S2. For another example, the top electrode UE may completely fill the through holes TH, the first spaces S1, and the second spaces S2. The top electrode UE may be formed of one or more of an impurity-doped semiconductor material, a metallic material, a metal nitride material, and a metal silicide material. The top electrode UE may be formed of a refractory metallic material, such as cobalt, titanium, nickel, tungsten, and molybdenum. The top electrode UE may be formed of metal nitride, such as titanium nitride (TiN), titanium aluminum nitride (TiAlN), and tungsten nitride (WN). The top electrode UE may be formed of metal, such as platinum (Pt), ruthenium (Ru), and iridium (Ir).

According to some example embodiments of the present inventive concepts, a buffer layer 230 whose nitrogen content amount gradually increases as approaching the second support layer SL2 from the second mold layer 226 may be provided between the second mold layer 226 and the second support layer SL2, and thus the buffer layer 230 may be inhibited (or, alternatively, prevented) from being over-etched at its upper sidewall 50 adjacent to the second mold layer 226 when an anisotropic etching process is performed to form electrode holes EH. A distance may therefore be sufficiently provided between bottom electrodes LE formed in the electrode holes EH, and as a result, an electrical interference may be avoided between the bottom electrodes LE.

Although example embodiments have been described in connection with some example embodiments of the present inventive concepts illustrated in the accompanying drawings, it will be understood to those skilled in the art that various changes and modifications may be made without departing from the example embodiments of the present inventive concepts. It will be apparent to those skilled in the art that various substitution, modifications, and changes may be thereto without departing from the scope and spirit of the present inventive concepts.

What is claimed is:

1. A semiconductor device, comprising:
   a bottom electrode on a substrate, the bottom electrode having a pillar shape;
   a first support layer on a sidewall of the bottom electrode;
   a second support layer above the first support layer and on the sidewall of the bottom electrode; and
   a dielectric layer covering the sidewall and a top surface of the bottom electrode,
   wherein the bottom electrode includes:
      a lower segment between the first support layer and the second support layer; and
      an upper segment between the lower segment and the second support layer, the upper segment having a sidewall that protrudes from a sidewall of the lower segment such that a center of the sidewall has a sharp point, and
   wherein the bottom electrode has a concave segment which is a portion recessed from the top surface of the bottom electrode.

2. The semiconductor device of claim 1, wherein a width of the lower segment is uniform.

3. The semiconductor device of claim 1, wherein a width of the upper segment is greater than a width of the lower segment.

4. The semiconductor device of claim 1, wherein the concave segment is disposed at an upper corner of the bottom electrode.

5. The semiconductor device of claim 1, wherein the concave segment overlaps with the second support layer in a horizontal direction.

6. The semiconductor device of claim 1, wherein the dielectric layer covers top and bottom surfaces of the first and second support layers and a lateral surface of the first support layer.

7. The semiconductor device of claim 6, wherein the dielectric layer covers the concave segment.

8. The semiconductor device of claim 1, further comprising:
a top electrode on the bottom electrode,
wherein the dielectric layer is interposed between the bottom electrode and the top electrode.

9. The semiconductor device of claim 8, wherein the top electrode fills a first space defined by the first and second support layers and the sidewall of the bottom electrode, and a second space defined by a top surface of the substrate, the first support layer and the sidewall of the bottom electrode.

10. A semiconductor device, comprising:
a bottom electrode on a substrate, the bottom electrode having a pillar shape;
a first support layer on a sidewall of the bottom electrode;
a second support layer above the first support layer and on the sidewall of the bottom electrode; and
a dielectric layer covering the sidewall and a top surface of the bottom electrode,
wherein the bottom electrode includes:
a first part on the substrate, the first part being disposed below a top surface of the first support layer;
a second part on the first part, the second part being disposed between the top surface of the first support layer and a bottom surface of the second support layer; and
a third part on the second part, the third part being disposed above a top surface of the second support layer,
wherein the second part of the bottom electrode includes:
a lower segment between the first support layer and the second support layer; and
an upper segment between the lower segment and the second support layer, the upper segment having a sidewall that protrudes from a sidewall of the lower segment such that a center of the sidewall has a sharp point, and
wherein a width of the lower segment of the second part is the same as a width of the first part and a width of the third part, and
wherein the bottom electrode has a concave segment which is a portion recessed from the top surface of the bottom electrode.

11. The semiconductor device of claim 10, wherein the concave segment overlaps with the second support layer and the third part of the bottom electrode in a horizontal direction.

12. The semiconductor device of claim 10, wherein a width of the upper segment is greater than the width of the lower segment and the width of the third part.

13. The semiconductor device of claim 10, wherein each of the width of the lower segment and the width of the first part is uniform.

14. The semiconductor device of claim 10, wherein a width of the upper segment is maximized at a level where the sharp point is located.

15. The semiconductor device of claim 10, wherein the sharp point is closer to the second support layer than to the first support layer.

16. A semiconductor device, comprising:
a bottom electrode on a substrate, the bottom electrode having a pillar shape;
a first support layer on a sidewall of the bottom electrode;
a second support layer above the first support layer and on the sidewall of the bottom electrode; and
a dielectric layer covering the sidewall and a top surface of the bottom electrode,
wherein the bottom electrode includes:
a lower segment between the first support layer and the second support layer; and
an upper segment between the lower segment and the second support layer,
wherein a width of the upper segment increases and then decreases from a top surface of the first support layer to a bottom surface of the second support layer, and
wherein the bottom electrode has a concave segment which is a portion recessed from the top surface of the bottom electrode.

17. The semiconductor device of claim 16, further comprising:
an interlayer dielectric layer between the substrate and the bottom electrode; and
a contact plug in the interlayer dielectric layer, which is connected to the bottom electrode.

18. The semiconductor device of claim 17, wherein the dielectric layer conformally covers a top surface of the interlayer dielectric layer, the sidewall of the bottom electrode, top and bottom surfaces of the first and second support layers and a lateral surface of the first support layer.

19. The semiconductor device of claim 16, further comprising:
a top electrode on the bottom electrode,
wherein the dielectric layer is interposed between the bottom electrode and the top electrode, and
wherein the top electrode fills a first space defined by the first and second support layers and the sidewall of the bottom electrode, and a second space defined by a top surface of the substrate, the first support layer and the sidewall of the bottom electrode.

20. The semiconductor device of claim 16, a top surface of the second support layer is at the same level as the top surface of the bottom electrode.

* * * * *